US008917106B2

(12) United States Patent
Namburi et al.

(10) Patent No.: US 8,917,106 B2
(45) Date of Patent: Dec. 23, 2014

(54) FINE PITCH MICROELECTRONIC CONTACT ARRAY AND METHOD OF MAKING SAME

(75) Inventors: Laksmi Namburi, Baldwin Park, CA (US); Matt Losey, Baldwin Park, CA (US); Florent Cros, Baldwin Park, CA (US)

(73) Assignee: Advantest America, Inc., San Jose, CA (US)

( * ) Notice: Subject to any disclaimer, the term of this patent is extended or adjusted under 35 U.S.C. 154(b) by 0 days.

(21) Appl. No.: 13/511,137

(22) PCT Filed: Nov. 9, 2011

(86) PCT No.: PCT/US2011/059907
§ 371 (c)(1),
(2), (4) Date: May 21, 2012

(87) PCT Pub. No.: WO2013/070201
PCT Pub. Date: May 16, 2013

(65) Prior Publication Data
US 2014/0232427 A1    Aug. 21, 2014

(51) Int. Cl.
*G01R 1/067* (2006.01)
*G01R 3/00* (2006.01)
*G01R 1/073* (2006.01)
*H05K 13/00* (2006.01)

(52) U.S. Cl.
CPC .............. *G01R 1/06794* (2013.01); *G01R 3/00* (2013.01); *G01R 1/07357* (2013.01); *H01L 2224/13191* (2013.01); *H05K 13/0023* (2013.01); *G01R 1/07314* (2013.01)
USPC ............ 324/755.08; 324/755.07; 324/756.03; 324/762.03

(58) Field of Classification Search
None
See application file for complete search history.

(56) References Cited

U.S. PATENT DOCUMENTS

| 3,948,706 A | 4/1976 | Schmeckenbecher |
| 7,264,984 B2 | 5/1991 | Cadwell |
| 5,190,637 A | 3/1993 | Guckel |
| 5,476,211 A | 12/1995 | Khandros |
| 5,629,137 A * | 5/1997 | Leedy ........................... 430/313 |
| 5,917,707 A | 6/1999 | Khandros |
| 6,336,269 B1 | 1/2002 | Eldridge |
| 7,253,512 B2 | 8/2007 | Powell |
| 7,365,553 B2 | 4/2008 | Garabedian |

(Continued)

FOREIGN PATENT DOCUMENTS

JP    2007121198 A    5/2007
KR    1020070083503 A    8/2007

OTHER PUBLICATIONS

The International Search Report and Written Opinion issued in PCT/US2011/059907 on Apr. 24, 2012.

*Primary Examiner* — Melissa Koval
*Assistant Examiner* — Stephen G Armstrong
(74) *Attorney, Agent, or Firm* — Manuel de la Cerra

(57) ABSTRACT

Provided are microfabricated probe elements, including elastomer elements, and methods of making the same, that can be readily used with fine pitch microelectronic arrays, for instance by providing sufficient compliance in a small package, while minimizing deflection forces, and while precisely maintaining the planarity and positioning of the contact tips across vast grid arrays. Elastomer elements may be generated using photolithography, either directly or through a sacrificial lost-mold process. Elastomer probe elements are provided with rigid tip structures microfabricated thereon to improve contact pressure. A novel space transformation probe card assembly is also provided.

28 Claims, 10 Drawing Sheets

(56) References Cited

U.S. PATENT DOCUMENTS

| | | |
|---|---|---|
| 7,466,154 B2 | 12/2008 | Brodsky |
| 7,692,436 B2 | 4/2010 | Garabedian |
| 2002/0011859 A1* | 1/2002 | Smith et al. .................. 324/755 |
| 2005/0200375 A1 | 9/2005 | Sudin |
| 2007/0218572 A1 | 9/2007 | Wada et al. |
| 2008/0094085 A1* | 4/2008 | Hougham et al. ............ 324/754 |
| 2008/0197866 A1* | 8/2008 | Jo ................................. 324/754 |
| 2008/0252316 A1* | 10/2008 | Tervo et al. .................. 324/754 |

* cited by examiner

FIG. 3A1
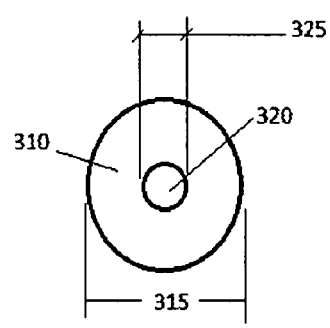
FIG. 3B1
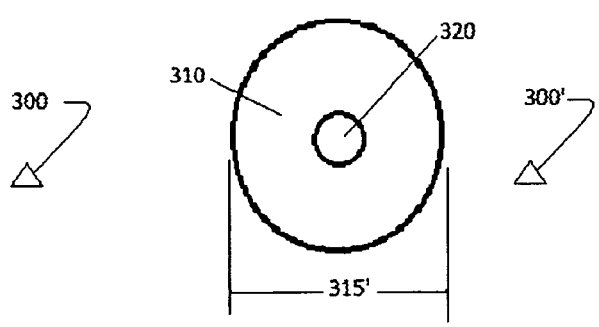
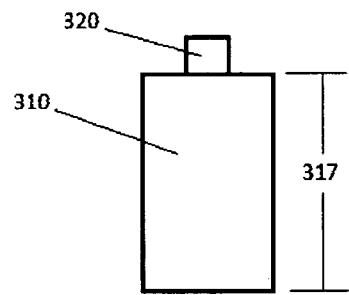
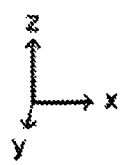
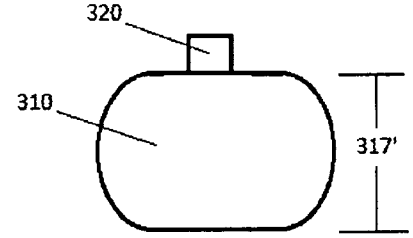
FIG. 3A2
FIG. 3B2

FIG. 4A1
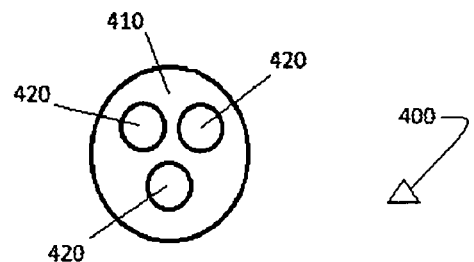
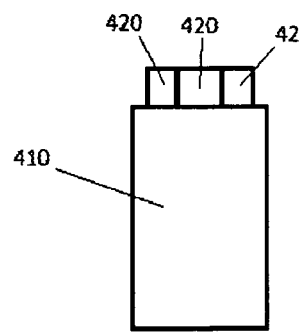
FIG. 4A2
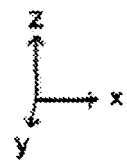

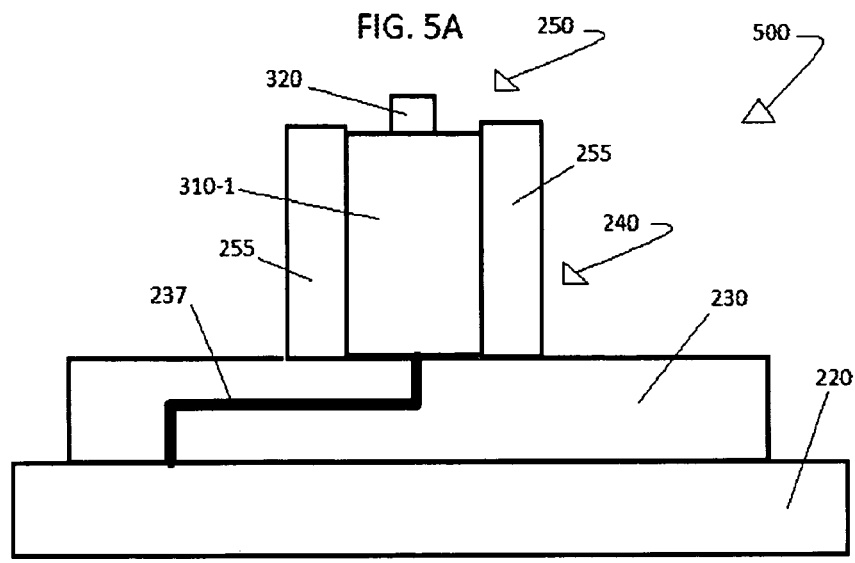
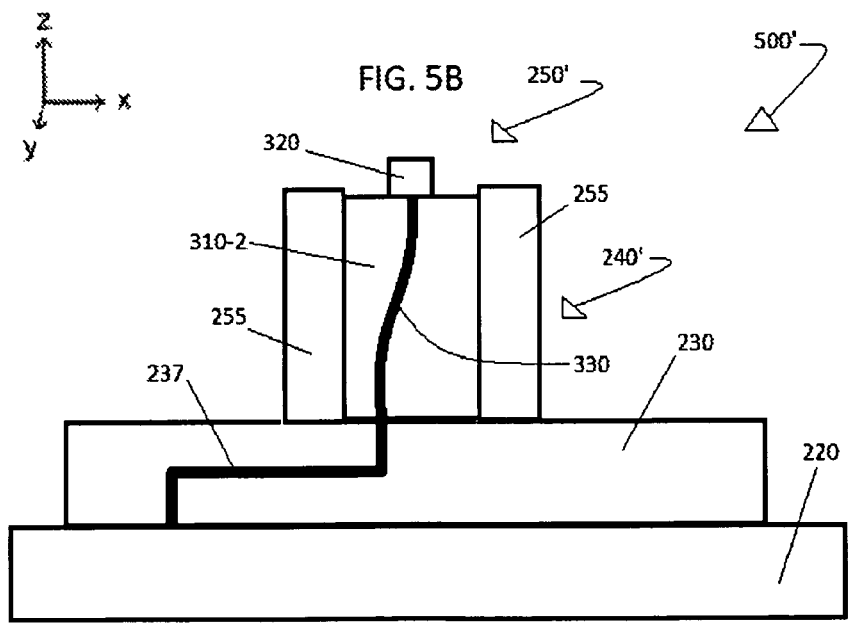

FINE PITCH MICROELECTRONIC CONTACT ARRAY AND METHOD OF MAKING SAME

CROSS REFERENCE TO RELATED APPLICATIONS

The present invention is filed under 35 U.S.C. §371 as the U.S. national phase of Internatinal Application No. PCT/US2011/059907, filed Nov. 9, 2011, which is hereby incorporated in its entirety including all tables, figures and claims.

FIELD OF THE INVENTION

The present invention relates to devices for testing semiconductor devices and more particularly to the design of probe contactors for such testing.

BACKGROUND OF THE INVENTION

Integrated circuits are made in a bulk parallel process by patterning and processing semiconductor wafers. Each wafer contains many identical copies of the same integrated circuit referred to as a "die." It may be preferable to test the semiconductor wafers before the die is cut into individual integrated circuits and packaged for sale. If defects are detected the defective die can be culled before wasting resources packaging a defective part. The individual die can also be tested after they have been cut into individual integrated circuits and packaged.

To test a wafer or an individual die—commonly called the device under test or DUT—a probe card is commonly used which comes into contact with the surface of the DUT. The probe card generally contains three unique characteristics: (1) an XY array of individual probes that move in the Z direction to allow contact with the die pad; (2) an electrical interface to connect the card to a circuit test apparatus; and (3) a rigid reference plane defined in such a way that the probe card can be accurately mounted in the proper location. When the probe card is brought in contact with the die pad, the Z-direction movement allows for a solid contact with the probe tip. The probe card ultimately provides an electrical interface that allows a circuit test apparatus to be temporarily connected to the DUT. This method of die testing is extremely efficient because many die can be tested at the same time. To drive this efficiency even higher, probe card manufactures are making larger probe cards with an ever-increasing numbers of probes.

The advent of three-dimensional interconnect and chip-stack packaging enabled by thru-silicon via (TSV) interconnection technology presents further challenges to the construction of probe cards. Devices for testing wafers that utilize TSV interconnections will need to be capable of connecting to fine-pitch grid arrays of solder bumps separated in the XY direction by as little as 50 µm (50 µm "pitch"), resulting in thousands of solder bumps being contacted simultaneously. Making electrical connections with the solder bumps, which may have, for instance, diameters of 25 µm, will require that the probes contact the bumps with sufficient force and scrubbing action to penetrate beyond the surface oxides for good contact. However, total probe forces must be minimized to avoid damage or fracture of the silicon wafers, because the wafers are weakened due to being thinned to approximately 50 µm to facilitate the thru-silicon vias.

Conventional probe systems are not well suited to testing these fragile, fine-pitch grid arrays. For example, conventional Vertical MEMS probes for conventional non-TSV semiconductor wafers suffer from a number of shortcomings when applied to weaker, fine-pitch TSV semiconductor wafers. First, such probes are typically fabricated separately and then individually assembled onto a ceramic guide plate, resulting in manufacturing variations in the planarity and positioning of the contact tips of the probes that are unacceptable in fine-pitch applications. Secondly, due to their metal alloy construction, such probes can only be deflected or deformed through a distance that is a small percentage of their size. Thus, when such probes are miniaturized for a fine-pitch application, the amount of available deflection or compliance for testing becomes too small. Likewise, the metal alloy construction of such probes requires a relatively large force to deflect each probe. When the number of such probes are multiplied to provide the density of contacts required in a fine-pitch application, the total deflection forces become quite large, which is contraindicated for thin TSV semiconductor wafers. Third, as a result of their imprecise positioning, the tips of such probes may slide off the hemispherical contact surface of a solder ball and provide a false reading and/or collide with a neighboring probe.

Similarly, conventional MEMS-based micro spring probes, including cantilever and torsion probes, are limited by their relatively large dimensions, which are required to achieve sufficient deflection or compliance with a metallic structure. Such probes also create excessive total force when applied to high-density, fine-pitch applications. Accordingly, such probes are ill-suited for the vast grid arrays used in fine-pitch TSV semiconductor wafers.

Likewise, conventional Membrane probes suffer from a number of shortcomings when applied to fine-pitch TSV semiconductor wafers. Deflection of one portion of the membrane causes lesser deflections of adjacent portions of the membrane. While this may be acceptable in some conventional applications, the high probe density required in fine-pitch applications results in unacceptable cross-deflections among adjacent Membrane probes, or mechanical "cross-talk," causing the probes to tend to move in unison instead of independently. Fine-pitch Membrane probes also tend to create high total forces on the wafers.

What is needed, therefore, are contact probes that can be readily used with fine pitch microelectronic arrays, for instance by providing sufficient compliance in a small package, while minimizing deflection forces, and while precisely maintaining the planarity and positioning of the contact tips across vast grid arrays.

SUMMARY OF THE INVENTION

A summary of various example aspects of the invention is provided below. Other aspects will be apparent to those of skill in the art and are expressly contemplated herein. The scope of the invention is intended to be limited by the language of the claims only, not by any summaries or descriptions of example embodiments.

In one aspect, provided is a probe head for a microelectronic contactor assembly, the probe head comprising: a space transformer substrate having a first surface opposite a second surface and a first space transforming, electrical interconnect therebetween, and a probe array having a third surface including electrical contacts thereon; a probe array having a third surface including electrical contacts thereon, wherein the probe array electrical contacts are in electrical communication with the electrical contacts of the space transformer substrate and wherein each probe in the array is comprised of a compliant and resilient elastomeric body having a width and defining a top surface, wherein a rigid microfabricated metal electronic-contactor tip is formed on the top surface, and the tip is in electrical communication with the electrical contacts of the third surface. In various embodiments, the first space transformer substrate may be comprised of multi-layer ceramic (MLC), including low temperature co-fired ceramic (LTCC). The second space transformer substrate may be comprised of a thin-film redistribution layer (RDL). The probe array may be comprised of microfabricated elastomer, and in various embodiments may have a pitch equal to or less than 300 µm, or in some cases equal to or less than 50 µm.

In another aspect, provided is a probe for a microelectronic contactor assembly, the probe comprising: a compliant and resilient elastomeric body having a width and defining a top surface, a bottom surface, and a side surface, wherein a rigid microfabricated metal electronic contactor tip is formed on the top surface. In various embodiments, the width of the compliant and resilient elastomeric body may be less than or equal to 150 µm, or in some cases less than or equal to 30 µm. At least a portion of the body may be cylindrical. The compliant and resilient elastomeric body may be comprised of silicone, including polydimethylsiloxane (PDMS), and may be comprised of electrically conductive material. An electrically conductive wirebond may be embedded in the compliant and resilient elastomeric body. The rigid microfabricated metal electronic contactor tip may be comprised of Rhodium. A second rigid microfabricated metal electronic contactor tip may be formed on the top surface. In some embodiments at least three rigid microfabricated metal electronic contactor tips may be formed on the top surface. A rigid shell may at least partially encompass the side of the compliant and resilient elastomeric body. In some embodiments, a force in the range of 0.1 to 2 gF pushing axially downward on the probe causes the probe to deflect downward by a distance in the range of 10 µm to 40 µm.

In yet another aspect, a probe array for a microelectronic contactor assembly is provided, the probe array comprising: a plurality of adjacent probes, each probe comprising: an electrically conductive reinforcing column adjacent to a compliant and resilient elastomeric column, the electrically conductive reinforcing column having a first top surface and the resilient elastomeric column having a second top surface; an electrically conductive column cap formed on the first top surface, the electrically conductive column cap electrically connected with an electrically conductive cantilever member that extends away from the first top surface and toward the second top surface where the electrically conductive cantilever member is electrically connected with an electrically conductive contact tip portion that is formed on the second top surface. The probe array may have a pitch equal to or less than 300 µm, or in certain cases equal to or less than 50 µm. The electrically conductive column cap, the electrically conductive cantilever member, and the electrically conductive contact tip portion of a probe may all be formed from a single piece of metal. The electrically conductive reinforcing column of a probe may comprise a metal post.

In still another aspect, a process of manufacturing forming a multi-layer ceramic (MLC) substrate with individual electrical conductive paths formed therein from electrical contacts having a first pitch on a tester side of the MLC substrate to electrical contacts having a second pitch on a probe side of the MLC substrate; fabricating a laminate of thin-film metal/dielectric composite thin film redistribution layer (RDL) directly on the probe side of the MLC substrate with individual electrical conductive paths formed therein from electrical contacts having the second pitch on a tester side of the RDL to electrical contacts having a third pitch on a probe side of the RDL; and fabricating an array of elastomer probes directly on the probe side of the RDL. The step of forming the MLC may further include forming 10 to 60 layers of ceramic laminated sheets with metal routing and vias. The step of forming the MLC may be performed using a low-temperature co-fired ceramic (LTCC) process. The thin film redistribution layer (RDL) may be fabricated to be a multi-layer organic (MLO). The array of elastomer probes may be fabricated to have a pitch approximately the same as or equal to the third pitch, which may be equal to or less than 300 µm, or in some cases equal to or less than 50 µm.

In the example process described above, the step of fabricating an array of elastomer probes directly on the probe side of the RDL may further comprise the steps of: depositing a thin electrically conductive metal layer on the probe side of the RDL; forming a metal base for the probe upon the thin electrically conductive metal layer; forming a sacrifical structure in the likeness of the probe upon the thin electrically conductive metal layer; electrodepositing a sacrificial metal upon the thin electrically conductive metal layer and thereby enveloping the sacrificial structure in the sacrificial metal; planarizing the sacrificial metal and thereby exposing a top surface of the sacrificial structure; removing the sacrificial structure, thereby leaving a void in the sacrificial metal at the location of the sacrificial structure; forming elastomeric probe material into the void in the sacrificial metal; depositing a second metal layer upon the elastomeric probe material and the sacrificial metal; forming a metal pad upon the second metal layer using photolithography or electroforming; forming a metal contact tip structure upon the metal pad using photolithography or electroforming; electrodepositing a second sacrificial metal upon the second metal layer and thereby enveloping the metal pad and metal contact tip in the second sacrificial metal; planarizing the second sacrificial metal and thereby exposing a top surface of the metal contact tip; and removing at least part of: the second sacrificial metal, the second metal layer, the first sacrificial metal, and the thin electrically conductive metal layer.

In various embodiments, the above example process may further comprise the step of removing at least a portion of the thin electrically conductive metal layer. The process may further comprise the step of depositing a thin electrically conductive metal layer on the probe side of the RDL comprises sputtering or vapor depositing. The thin electrically conductive metal layer deposited on the probe side of the RDL may comprise Ti, Cr, Au or Cu. The step of forming a metal base for the probe upon the thin electrically conductive metal layer may comprise forming a pattern in a negative photoresist such that the thin electrically conductive metal layer is exposed and the metal base is formed through electrodeposition in the pattern. The step of forming a sacrifical structure in the likeness of the probe upon the thin electrically conductive metal layer may comprise using photolithography to form a structure out of photoresist material. The step of planarizing the sacrificial metal may comprise any of the steps of lapping, polishing, chemical-mechanical polishing, or diamond turning. The step of removing the sacrificial structures may comprise either solvent dissolution or vapor-phase etching. The step of forming elastomeric probe material into the voids in the sacrificial metal may comprise casting a thermosetting silicone elastomer, such as polydimethylsiloxane (PDMS). The probe material may be selected to be electrically conductive. The step of forming elastomeric probe material into the voids in the sacrificial metal may further comprise planarizing the elastomeric probe material in the sacrificial metal. The step of forming a metal pad upon the second metal layer may comprise performing the Guckel process. The step of forming a metal contact tip structure upon the metal pad may comprise forming the metal contact tip structure out of hard, corrosion-resistant metal, such as Rhodium. The step of removing at least part of: the second sacrificial metal, the second metal layer, the first sacrificial metal, and the thin electrically conductive metal layer, may comprise wet or dry etching. Metal may be embedded in the elastomeric probe material. The process may further comprise the step of embedding a wirebond in the elastomeric probe material. The process may further comprise the step of at least partially encasing the elastomeric probe material in an outer rigid shell, which may be formed from a conductive metal. The process may further comprise the step of microfabricating the outer rigid shell directly in place using photolithography or electroforming.

BRIEF DESCRIPTION OF THE DRAWINGS

FIG. 2A is an isometric view of example components, and FIG. 2B is a diagram depicting the flow of electricity through the assembly.

FIG. 3 shows a probe according to one example embodiment, where FIG. 3A1 is a top plan view of the probe in an uncompressed state, FIG. 3A2 is a side elevation view of the probe in an uncompressed state, FIG. 3B1 is a top plan view of the probe in a compressed state, and FIG. 3B2 is a side elevation view of the probe in a compressed state.

FIG. 4 shows a probe according to one example embodiment, where FIG. 4A1 is a top plan view of the probe in an uncompressed state, and FIG. 4A2 is a side elevation view of the probe in an uncompressed state.

DETAILED DESCRIPTION OF THE PREFERRED EMBODIMENTS

This specification describes exemplary embodiments and applications of the invention. The invention, however, is not limited to these exemplary embodiments and applications or to the manner in which the exemplary embodiments and applications operate or are described herein.

Figure 1A:
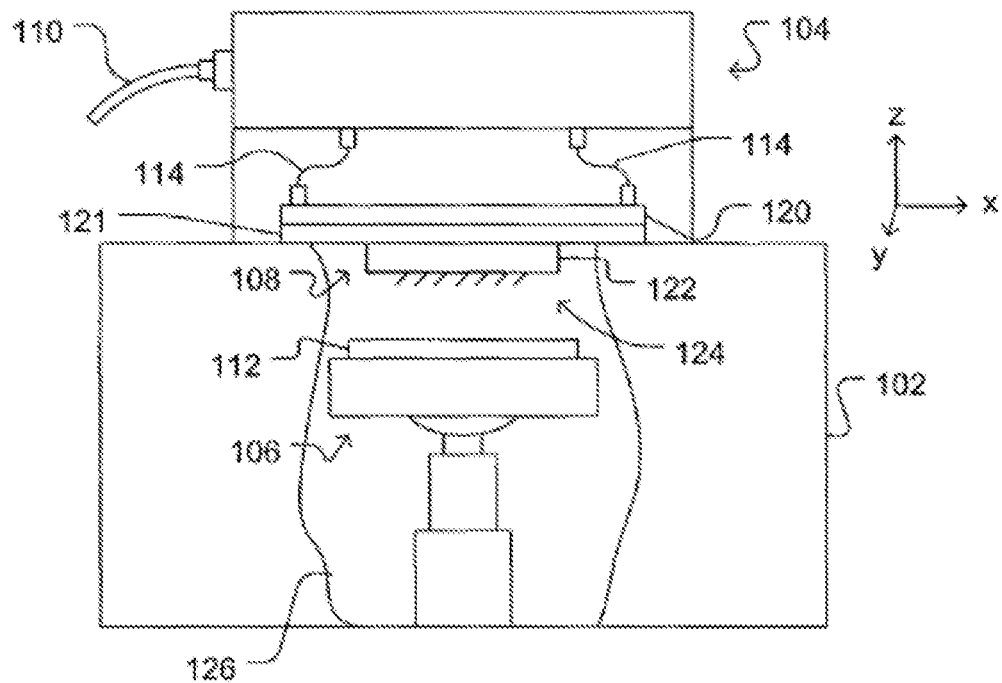
FIG. 1A shows a side view of an exemplary prior art prober, test head, and probe card assembly. A cut-out provides a partial view of the inside of the prober.

FIG. 1A illustrates an exemplary prior art probing system used to test dies (not shown) on a newly manufactured semiconductor wafer 112 or other electronic devices. The probing system of FIG. 1A includes a test head 104 and a prober 102 (which is shown with a cut-away 126 to provide a partial view of the inside of the prober 102). To test the dies (not shown) of the semiconductor wafer 112, the wafer 112 is placed on a moveable stage 106 as shown in FIG. 1A, and the stage 106 is moved in the "Z" direction such that terminals (not shown) on dies (not shown) of the wafer 112 are brought into contact with probes 124 of a probe card assembly 108. (The horizontal plane is in the directions labeled "x, y" in FIG. 1A and will hereinafter be referred to as "x, y" movement. In FIG. 1A, the direction labeled "x" is horizontal across the page, the direction labeled "y" is horizontal into and out of the page, and the direction labeled "z" is vertical. These directions are relative and for convenience and are not to be taken as limiting.) Temporary electrical connections are thus established between the probes 124 and dies (not shown) of the wafer 112 to be tested.

Typically, a cable 110 or other communication means connects a tester (not shown) with the test head 104. Electrical connectors 114 electrically connect the test head 104 with the probe card assembly 108. The probe card assembly 108 shown in FIG. 1A includes a wiring board 120, which can provide electrical connections from connectors 114 to the probe substrate 122, and the probe substrate 122 can provide electrical connections to the probes 124.

The cable 110, test head 104, and electrical connectors 114 thus provide electrical paths between the tester (not shown) and the probe card assembly 108, and the probe card assembly 108 extends those electrical paths to the probes 124. Thus, while the probes 124 are in contact with the terminals (not shown) of the dies (not shown) on the wafer 112, cable 110, test head 104, electrical connectors 114, and probe card assembly 108 provide a plurality of electrical paths between the tester (not shown) and the dies (not shown). The tester (not shown) writes test data through these electrical paths to the dies (not shown), and response data generated by the dies (not shown) in response to the test data is returned to the tester (not shown) through these electrical paths.

Figure 1B:
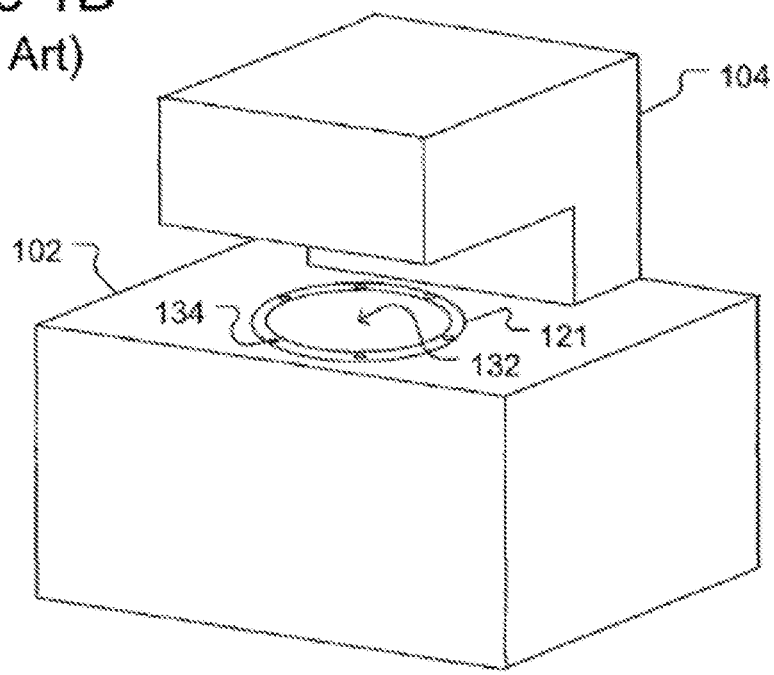
FIG. 1B shows a perspective view of the prober and test head of FIG. 1A without a probe card assembly.

In conventional systems, the probe substrate 122 is typically attached directly to the wiring board 120, which in turn is attached to a test head plate 121 on the prober 102. A shown in FIG. 1B, the test head plate 121 forms an opening 132 in the prober 102 into which the probe substrate 122 fits (as generally shown in FIG. 1A). The test head plate 121 may include holes 134 for bolts that secure the probe card assembly 108 to the test head plate 121.

The example probing system described above is for reference only. While certain embodiments disclosed herein may be used with such a system, the present invention is not limited to use with that or any other particular probing system.

Figure 2A:
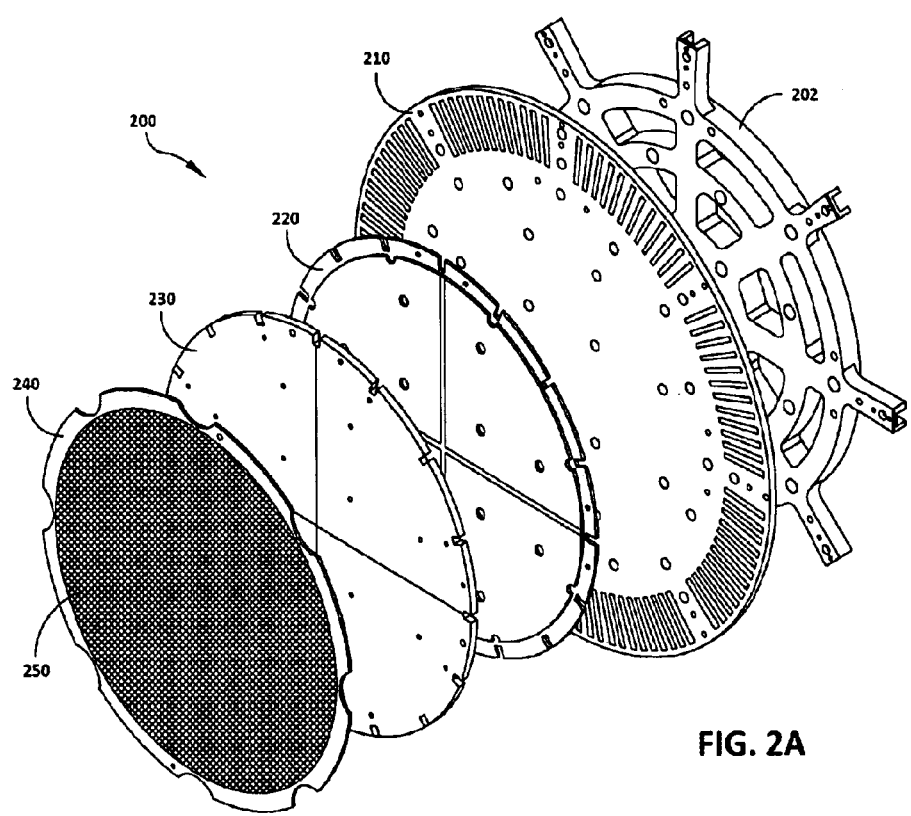
FIGS. 2A and 2B are exploded diagrams showing the principal components of an exemplary space transformation probe card assembly.
Figure 2B:
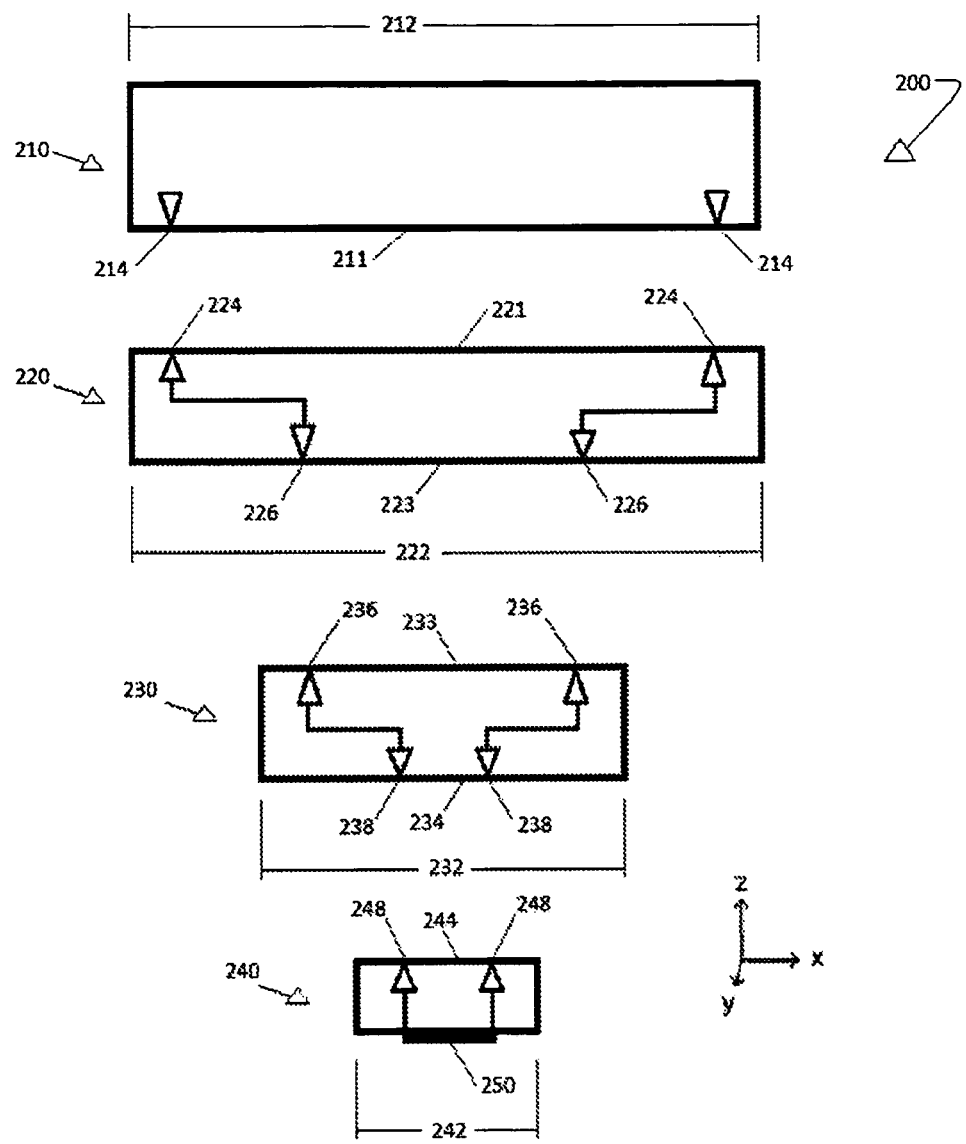

Fine-pitch microelectronic arrays will now be described that may be adapted for use with probing systems. FIGS. 2A and 2B are exploded diagrams showing the principal components of an exemplary space-transformation probe card assembly 200 for use in transforming a conventional probe substrate 122 or Printed Circuit Board (PCB) 210 to a fine-pitch microelectronic array of contact probes 250. FIG. 2A shows example components of such an assembly 200, while FIG. 2B provides a diagram depicting the flow of electricity through the assembly 200. Assembly 200 may comprise a stiffener 202, supporting a Printed Circuit Board (PCB) 210, which may be attached to a first space transformer 220, such as a low temperature co-fired ceramic (LTCC) or other multilayer ceramic (MLC), where the MLC or LTCC 220 has a thin-film redistribution layer (RDL) formed thereon to create a second space transformer 230, and where the RDL 230 may have a probe assembly or array 240 with probes 250 formed directly thereon.

As shown in FIG. 2B, an interface on PCB 210 has a first width 212, for example 38 mm, and has electrical connection points 214 located at a first pitch, for example 760 µm, to create an array of electrical contacts 214, for instance a 50-by- 50 array. The MLC or LTCC 220 has a second width 222, which may also be the same as width 212, for example 38 mm, and has electrical connection points 224 that may be located at a pitch that is the same as the first pitch of PCB 210, for example 760 μm, to create a corresponding array of electrical contacts 224, for instance a 50-by-50 array. When a first surface 211 of PCB 210 is connected adjacent a second surface 221 of LTCC 220, electrical contacts 214 are in electrical connection with electrical contacts 224, which allows electricity to flow from electrical contacts 214, through LTCC 220, to electrical contacts 226 on a third surface 223 of LTCC 220. Electrical contacts 226 may be provided at a second, finer pitch, for example 300 μm, to create a denser array of electrical contacts 226 on surface 223, which may for instance still be a 50-by-50 array.

Thin-film redistribution layer (RDL) 230 has a third width 232, which may be smaller than widths 212 and 222, for example 15 mm, and has electrical connection points 236 that may be located at a pitch that is the same as the second pitch, for example 300 μm, to create a corresponding array of electrical contacts 236, for instance a 50-by-50 array. When third surface 223 of LTCC 220 is connected adjacent a fourth surface 233 of Thin-film RDL 230, electrical contacts 226 are in electrical connection with electrical contacts 236, which allows electricity to flow from electrical contacts 226, through Thin-film RDL 230, to electrical contacts 238 on a fifth surface 234 of Thin-film RDL 230. Electrical contacts 238 may be provided at a third, still finer pitch, for example 50 μm (or alternatively, up to 300 μm), to create a yet denser array of electrical contacts 238 on surface 234, which may for instance still be a 50-by-50 array.

Probe assembly or array 240 has a fourth width 242, which may be smaller than widths 212, 222, and 232, for example 2.5 mm, and has electrical connection points 248 that may be located at a pitch that is the same as the third pitch, for example 50m, to create a corresponding array of electrical contacts 248, for instance a 50-by-50 array. When fifth surface 234 of Thin-film RDL 230 is connected adjacent a sixth surface 244 of probe assembly or array 240, electrical contacts 238 are in electrical connection with probes 250, which allows electricity to flow from electrical contacts 238, through probe assembly or array 240, to probes 250. Probes 250 may be provided at the same pitch as the third pitch, for example 50 μm, to create a fine pitch array of probes 250, which may for instance still be a 50-by-50 array.

The space-transformation probe card assembly 200 described above is an example embodiment, and except as otherwise recited in the claims, the present invention is not limited to use with that or any other particular space-transformation probe card assembly. Other non-limiting examples of probe card assemblies can be found in U.S. Pat. No. 7,365,553, the contents of which are incorporated herein by reference.

Figure 1C:
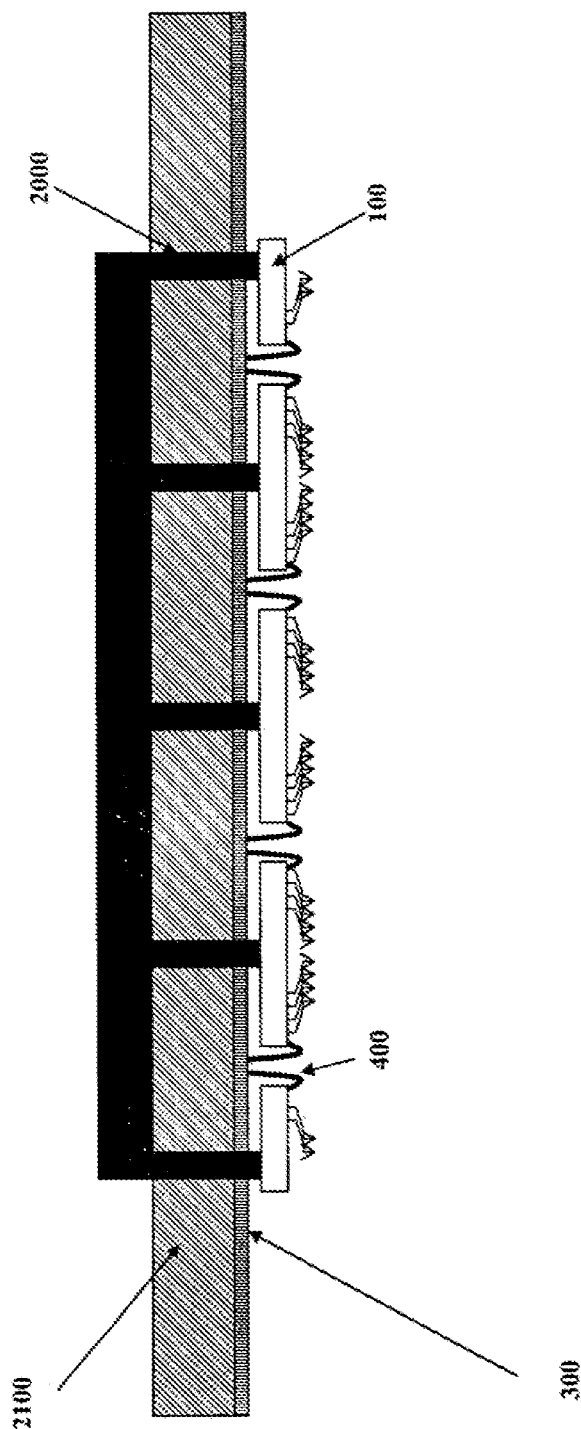
FIG. 1C shows a side view of a probe card assembly from U.S. Pat. No. 7,692,436.

Probes will now be described that may be adapted for use with fine-pitch microelectronic arrays. FIG. 3 depicts an example cylindrical probe 300 that includes a compliant and resilient elastomeric portion 310 topped by a rigid metal contact tip portion 320. FIG. 3A1 is a top plan view of the probe 300 in an uncompressed state, FIG. 3A2 is a side elevation view of the probe 300 in an uncompressed state, FIG. 3B1 is a top plan view of the probe 300 in a compressed state (300'), and FIG. 3B2 is a side elevation view of the probe 300 in a compressed state (300'). In its uncompressed state, compliant and resilient elastomeric portion 310 has a cross-sectional outer diameter 315, which can range from, for example, 30 μm to 150 μm, and an axial vertical height in the Z direction 317. Metal contact tip portion 320 has a cross-sectional outer diameter 325, which is typically smaller than diameter 315. When compressed in the Z direction, for instance when being used to make electrical contact, compliant and resilient elastomeric portion 310 tends to have a shorter axial vertical height 317', and an increased cross-sectional outer diameter 315'. Numerous cylindrical probes 300 may be placed adjacent to each other in two-dimensional (XY) arrays, providing enough space between the probes 300 to allow for the increase in diameter from 315 to 315' upon compression during use.

In alternative embodiments, shapes other than cylinders can be used for either resilient elastomeric portion 310 and/or metal contact tip portion 320. In the example embodiment shown, resilient elastomeric portion 310 and metal contact tip portion 320 are located coaxially about a single central vertical Z axis. In alternative embodiments, resilient elastomeric portion 310 and metal contact tip portion 320 may be located with their respective vertical axes in different locations. Additionally, multiple contact tip portions 320 can be provided, as shown in FIG. 4.

FIG. 4 depicts an example cylindrical probe 400 that includes a compliant and resilient elastomeric portion 410 topped by three metal contact tip portions 420. FIG. 4A1 is a top plan view of the probe 400 in an uncompressed state, and FIG. 4A2 is a side elevation view of the probe 400 in an uncompressed state. Multiple tips per probe may improve contact-to-solder bump geometry. In other embodiments, different numbers of metal contact tip portions 420 may be used, such as two, four, or more. Probe 400 may otherwise share the dimensions, materials, features, characteristics, applications, and alternative embodiments of probe 300.

FIG. 5 shows three cross-sections of example elastomer probe assemblies 500, 500' and 500". FIG. 5A is a cross-section of elastomer probe assembly 500, which includes a fine pitch array probe 250 comprising a compliant and resilient elastomeric portion 310-1 topped by a metal contact tip portion 320 and encased in an optional rigid support structure 255. In various embodiments, rigid structure 255 may optionally be provided to control the compliance and compressive forces of compliant and resilient elastomeric portion 310. Electricity flows in conductive path 237 from LTCC 220 through thin-film RDL 230 to compliant and resilient elastomeric portion 310-1. In this embodiment, compliant and resilient elastomeric portion 310-1 is itself conductive, for instance through the addition of electrically-conductive particles to the elastomer, such as Gold. Accordingly, electricity flows from conductive path 237 through compliant and resilient elastomeric portion 310-1 to metal contact tip portion 320, where it can make electrical contact with the wafer to be tested.

FIG. 5B is a cross-section of elastomer probe assembly 500', which includes a fine pitch array probe 250' comprising a compliant and resilient elastomeric portion 310-2 topped by a metal contact tip portion 320 and encased in a rigid support structure 255. Electricity flows in conductive path 237 from LTCC 220 through thin-film RDL 230 to wirebond 330, which is embedded in and runs through compliant and resilient elastomeric portion 310-2 to metal contact tip portion 320. In this embodiment, compliant and resilient elastomeric portion 310-2 need not be conductive, because the electricity runs through embedded wirebond 330. Accordingly, electricity flows from conductive path 237 through wirebond 330 to metal contact tip portion 320, where it can make electrical contact with the wafer to be tested. Non-limiting examples of composite structures formed of a core wire bonded to a conductive terminal on a probe head assembly that is over coated with a resilient material are described in U.S. Pat. Nos. 5,476,211, 5,917,707, and 6,336,269, all of which are incorporated herein by reference.

Figure 5C:
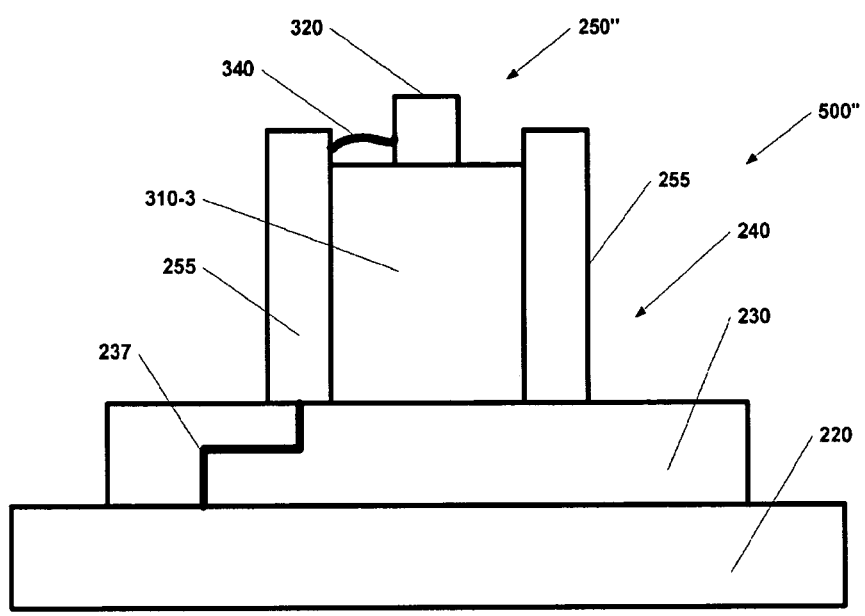
FIG. 5 shows cross-sections of two example elastomer probe assemblies, with FIG. 5A being a side elevation cross-sectional view of a first example elastomer probe assembly, FIG. 5B being a side elevation cross-sectional view of a second example elastomer probe assembly, and FIG. 5C being a side elevation cross-sectional view of a third example elastomer probe assembly.

FIG. 5C is a cross-section of elastomer probe assembly 500", which includes a fine pitch array probe 250" comprising a compliant and resilient elastomeric portion 310-3 topped by a metal contact tip portion 320 and encased in a rigid support structure 255, which is also electrically conductive. Electricity flows in conductive path 237 from LTCC 220 through thin-film RDL 230 to rigid support structure 255, to conductive bridge 340 that then connects to the contact tip portion 320. In this embodiment, compliant and resilient elastomeric portion 310-3 need not be conductive, because the electricity runs through the rigid support structure 255. Accordingly, electricity flows from conductive path 237 through the rigid support structure 255 and bridge 340 to metal contact tip portion 320, where it can make electrical contact with the wafer to be tested. The bridge may comprise a variety of structures, examples of which may include but are not limited to as a wire, spring, and foil. The bridge 340 should be flexible enough to maintain an electrical connection between rigid support structure 255 and the contact tip portion 320 while the elastomer 310-3 is compressed. The rigid support structure 255 may also allow some flexure (i.e., it may be semi-rigid) so as to assist in maintaining an electrical contact with the bridge 340.

Figure 6:
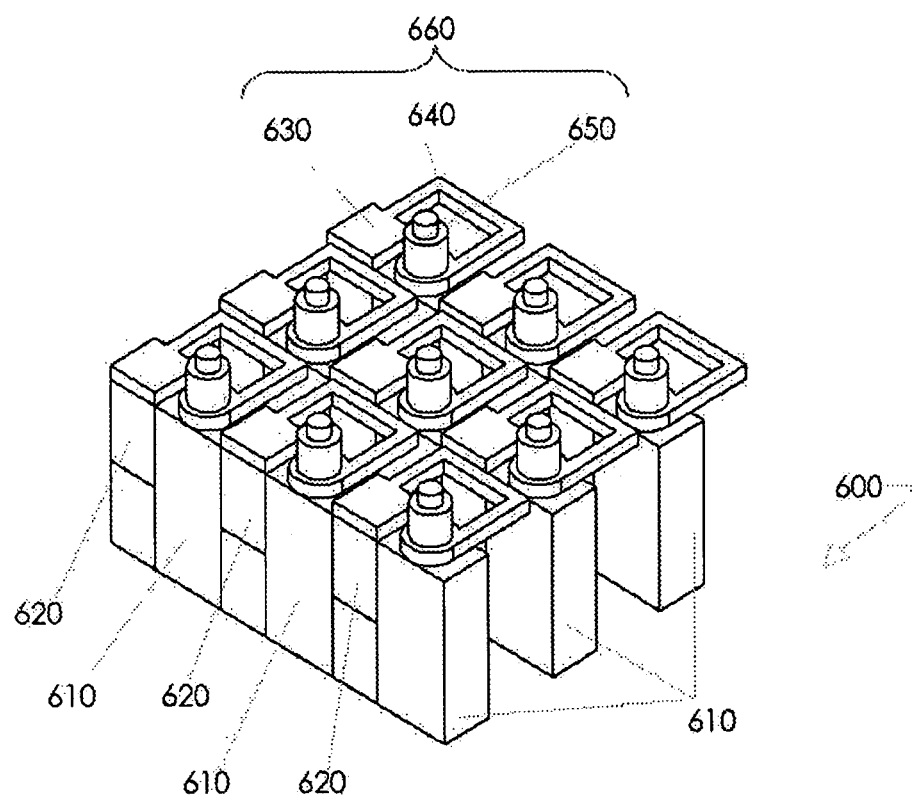
FIG. 6 is an isometric view of an array of nine probes according to an example embodiment.

FIG. 6 is an isometric depiction of an array 600 of nine probes 660 according to another example embodiment adapted for use with fine pitch arrays. While not shown in FIG. 6, array 600 could be placed on thin-film RDL 230 such that electrical connections 238 aligned and electrically interfaced with conductive columns 620. In that and similar examples, electricity would flow through reinforcing conductive columns 620, which may be metal posts for example, through column cap 630, through cantilever 640, to contact tip portion 650, where it can make electrical contact with the wafer to be tested. Column cap 630, cantilever 640, and contact tip portion 650 all define an electrically conductive path, and may be formed from or into a single piece of metal. Each contact tip portion 650 rests upon a compliant and resilient elastomeric portion 610. Compliant and resilient elastomeric portions 610 are adjacent to, and may be at least partially contained between, reinforcing conductive columns 620, thus forming continuous rows of material that alternates between elastomeric 610 and reinforcing 620 portions. Such rows are separated from each other by air gaps, as shown in FIG. 6. When downward vertical force is applied to any contact tip portion 650, contact tip portion 650 resiliently deflects downward, pushing against and elastically deforming compliant and resilient elastomeric portion 610. Cantilever 640 provides a flexible mechanism that allows contact tip portion 650 to deflect downward relative to column cap 630. Probes 660 may be formed according to this design with a fine pitch, such as for example 50 μm.

The fine pitched probe arrays just described can be used in any number of probe card assemblies. For example, FIG. 1C from U.S. Pat. No. 7,692,436 depicts a space transformer 300 is integrated into the PCB 2100, using High Density Interconnnect (HDI). The HDI technology is adapted to function as both the interposer and the space transformer. A monolithic (or tiled) probe contactor substrate 100 is attached to the mechanical frame 2000, and the bond interconnects 400 are formed directly to the integrated PCB/HDI space transformer 300. The fine pitched probe arrays just described can be used and attached via the bond interconnects 400 to the space transformer 300.

In the various examples described above, each probe may be designed to afford approximately 10 μm to 40 μm of compliance, depending on the pitch, by using low-modulus, high compressive strain polymer material for the compliant and resilient elastomeric portions. Example materials may include silicone elastomers such as polydimethylsiloxane (PDMS). Also, in the designs above each elastomer probe is individually compliant. Using various support and elastomer containment structures, the resulting compressive forces can be tailored to approximately the 0.1 to 2 gF range to reduce damage to the solder balls and avoid damage to the thinned silicon TSV wafer. Contact tip portions may comprise any suitably rigid, hard, durable and conductive material, such as Rhodium. Each of the disclosed designs may be used with a fine pitch, such as for example 50 μm.

The elastomeric probes and assemblies thereof described above are example embodiments, and except as otherwise recited in the claims, the present invention is not limited to use with those or any other particular elastomeric probe assemblies.

Figure 7:
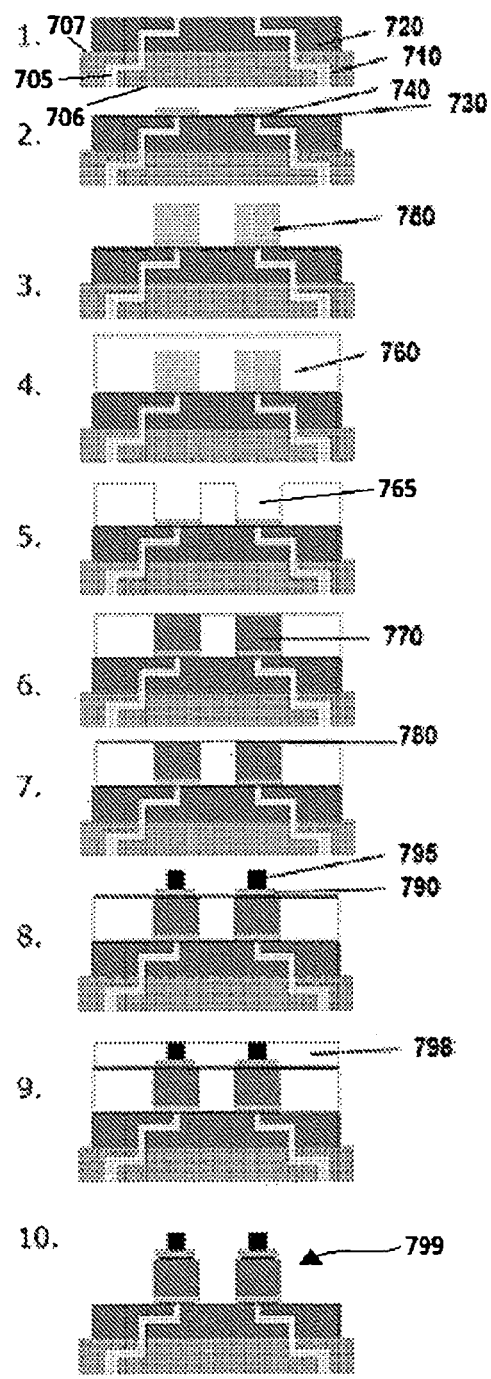
FIG. 7 is a flow diagram depicting an example method of manufacturing probes according to one embodiment.

Methods of manufacturing probes that may be adapted for use with fine-pitch microelectronic contact arrays will now be described. FIG. 7 depicts a series of steps for manufacturing fine-pitch microelectronic contact arrays, including the steps of generating probes with a patterned elastomer array of highly compliant and resilient material fabricated directly on the probe card in final position, photolithographically defining metal contact tips in precise locations thereon, and planarizing the tips to improve planarity and thus reduce the amount of compliance or deflection required to ensure that all the tips make proper contact during use.

For instance, the example method 700 in FIG. 7 describes the construction of a probecard made up of a small pitch array of microfabricated elastomer-based contact probes 799. This example method may comprise the following steps. As shown in Step 1 of FIG. 7, individual electrical conductive paths 705 may be formed in a multi-layer ceramic (MLC) 710 where the pad pitch on the tester side 706 is amenable to standard printed circuit board (PCB) pitch, and is transformed or redistributed to a smaller pitch on the probe side 707 of the MLC 710. The MLC 710 may comprise, for example, 10 to 60 layers of ceramic laminated sheets with metal routing and vias, as typical with a low-temperature co-fired ceramic (LTCC) process. See e.g. U.S. Pat. No. 3,948,706, which is incorporated in its entirety herein. Upon the probe side surface 707 of the MLC 710 is fabricated a laminate or stack of thin-film metal/dielectric composite thin film redistribution layer (RDL) 720, also known in some embodiments as a multi-layer organic (MLO) 720, that further transforms or redistributes the electrical conductive paths from the pitch amenable to manufacture of the MLC 710 to an even smaller pitch, such as that used with probing thru-silicon vias. See e.g. U.S. Pat. No. 7,253,512, which is incorporated in its entirety herein. An array of elastomer probes 799 may then be fabricated upon the thin film RDL or MLO stack 720 as described below.

As shown in Step 2 of FIG. 7, a thin metal layer 730 may be deposited upon the RDL 720 to form a conduction layer and to provide adhesion to the underlying structure 720. This thin metal layer or "seed" layer 730 may provide the initial conductive layer for forming through-resist electroformed structures. At the end of the process layer 730 may be removed in a pattern through a wet or dry etch method to electrically isolate the elastomer probes 799. Owing to the relative thinness of the seed layer 730 to the overall metal structure, the process of removing the seed layer 730 with patterned structures thereon, effectively removes the metal seed film from unpatterned areas while the seed layer 730 under the patterned areas is protected from removal. The metal film 730 may be sputtered or vapor deposited, preferably with an adhesion promoting layer such as Ti or Cr (50 to 1000 A) followed by 500 to 5000 A of Au or Cu. A metal base 740 for the probe 799 may be formed upon the seed layer 730 by any number of patterning techniques, exemplified by the formation of the pattern in a negative photoresist such that the metal seed 730 is exposed and the pad formed through electrodeposition in the pattern or mold. See e.g. U.S. Pat. Nos. 7,264,984 and 5,190,637, which are incorporated in their entirety herein.

As shown in Step 3 of FIG. 7, a sacrifical structure 750 in the likeness of the probe 799 may be formed through any number of microfabrication methods, for instance using photolithography that forms the structure out of photoresist, such as SU-8. The purpose of structure 750 is to become, in effect, a lost mold, per the process described below.

As shown in Step 4 of FIG. 7, after the formation of the probe form 750 out of photoresist, a sacrificial metal 760 (such as Cu) may be electrodeposited upon the metal seed 730 to envelope the probe form 750 in metal 760. Metal 760 may then be planarized or milled down to expose the tops of photoresist probe forms 750, and the forms 750 may then be removed through such means as solvent dissolution or vapor-phase etching, thereby producing the metal structure or "mold" 765 for molding the elastomer probes 799, as shown in Step 5 of FIG. 7. The array of photoresist structures 750 enveloped in metal 760 may be planarized through such means as lapping, polishing, chemical-mechanical polishing, diamond turning, or the like.

As shown in Step 6 of FIG. 7, the probe material 770 may then be formed into the molds 765. In some embodiments this may be accomplished by casting a thermosetting silicone elastomer such as polydimethylsiloxane (PDMS). The elastomer may be conductive, which may be achieved through the incorporation of conductive metal particles into the elastomer. See e.g. U.S. Pat. No. 7,466,154, which is incorporated in its entirety herein. The casting may be performed such that excess elastomer material 770 protrudes above the mold 765, or such that excess material is removed and the elastomer material 770 remains flush or near-so with the top of the mold 765. The height of the elastomer material 770 may be precisely defined though an additional planarization step as described above. The sacrificial metal mold 765 may support the elastomeric structures 770 during such a planarization process.

After any additional planarizing of the elastomer probe elements 770, the contacting tip structure 795 may then be formed through a method similar to that described above, through the use of a thin metal layer 780 and patterned formation of the tip elements 790, 795, as shown in Steps 7-10 of FIG. 7. For example, a second metal seed layer 780 may be deposited upon the planarized mold-elastomer construct described above, as shown in Step 7. Using photolithography and electroforming, such as the Guckel process known to those of ordinary skill in the art, a metal pad 790 may be formed upon the second metal seed layer 780 to provide support to a tip structure 795. The tip structure 795 may then be formed out of a metal suitable for electrical contacts, such as a hard, corrosion-resistant metal like Rhodium, using photolithography to precisely define the tip positions.

As shown in Step 9 of FIG. 7, a sacrificial metal 798 may then be electrodeposited upon the metal layer 780 to envelope the metal pad 790 and tip structure 795 in metal 798. Metal 798 may then be planarized or milled down to expose the tops of tip structures 795. Metal 798 may support the pad 790 and tip 795 structures during planarization.

Then as shown in Step 10 of FIG. 7, the probes 799 may be exposed for use by removing the surrounding metal layers. In the example shown, the sacrificial metal layer 798 may be removed, then the metal seed layer 780, then the sacrificial metal 760, and finally the metal seed layer 730. Removal of these metal films is accomplished by any number of wet or dry etch methods. See e.g. U.S. Pat. No. 7,264,984, which is incorporated in its entirety herein.

Alternatively, some form of metal may be embedded into the elastomer 770 to improve electrical connection. The metal may be in the form of a thin wirebond 330 encased with the elastomer 770, as shown in FIG. 5. Also, the elastomer may be encased in an outer rigid shell 255 as shown in FIG. 5. An outer shell 255 may serve to support the elastomer 770 during deflection, thereby increasing its stiffness and the force generated. The outer shell 255 may be formed from a conductive metal to facilitate electrical conduction and reduce path resistance. The optional outer shell 255 may be microfabricated directly in place using the same photolithography and electroforming methods described above. For example, a negative photoresist may be used to define the pattern of the shell 255, and a suitable metal such as nickel or high strength nickel alloy like Ni—Mn or Ni—Co may be electroformed to form the shell 255.

While the description above refers to particular embodiments of the present invention, it should be readily apparent to people of ordinary skill in the art that a number of modifications may be made without departing from the spirit thereof. The accompanying claims are intended to cover such modifications as would fall within the true spirit and scope of the invention. The presently disclosed embodiments are, therefore, to be considered in all respects as illustrative and not restrictive, the scope of the invention being indicated by the appended claims rather than the foregoing description. All changes that come within the meaning of and range of equivalency of the claims are intended to be embraced therein. Moreover, the applicants expressly do not intend that the following claims be interpreted as "strictly coextensive" with the embodiments in the specification, as described in *Phillips v. AHW Corp.*, 415 F.3d 1303, 1323 (Fed. Cir. 2005) (en banc).

The invention claimed is:

1. A process of manufacturing an array of elastomer probes on a surface comprising the steps of:
    depositing a thin electrically conductive metal layer on the surface;
    forming a metal base for the probe upon the thin electrically conductive metal layer;
    forming a sacrificial structure in the likeness of the probe upon the thin electrically conductive metal layer;
    electrodepositing a sacrificial metal upon the thin electrically conductive metal layer and thereby enveloping the sacrificial structure in the sacrificial metal;
    planarizing the sacrificial metal and thereby exposing a top surface of the sacrificial structure;
    removing the sacrificial structure, thereby leaving a void in the sacrificial metal at the location of the sacrificial structure;
    forming elastomeric probe material into the void in the sacrificial metal;
    depositing a second metal layer upon the elastomeric probe material and the sacrificial metal;
    forming a metal pad upon the second metal layer using photolithography or electroforming;
    forming a metal contact tip structure upon the metal pad using photolithography or electroforming;

electrodepositing a second sacrificial metal upon the second metal layer and thereby enveloping the metal pad and metal contact tip in the second sacrificial metal;

planarizing the second sacrificial metal and thereby exposing a top surface of the metal contact tip; and removing at least part of: the second sacrificial metal, the second metal layer, the first sacrificial metal, and the thin electrically conductive metal layer.

2. The process of claim 1, wherein the surface is selected from a group consisting of:
multi layer organic, thin film redistribution layer, ceramic, and combinations thereof.

3. The process of claim 1, further comprising the step of removing at least a portion of the thin electrically conductive metal layer.

4. The process of claim 1, wherein the step of depositing a thin electrically conductive metal layer on the surface comprises sputtering or vapor depositing.

5. The process of claim 1, wherein the thin electrically conductive metal layer deposited on the surface comprises Ti, Cr, Au or Cu.

6. The process of claim 1, wherein the step of forming a metal base for the probe upon the thin electrically conductive metal layer comprises forming a pattern in a negative photoresist such that the thin electrically conductive metal layer is exposed and the metal base is formed through electrodeposition in the pattern.

7. The process of claim 1, wherein the step of forming a sacrificial structure in the likeness of the probe upon the thin electrically conductive metal layer comprises using photolithography to form a structure out of photoresist material.

8. The process of claim 1, wherein the step of planarizing the sacrificial metal comprises any of the steps of lapping, polishing, chemical-mechanical polishing, or diamond turning.

9. The process of claim 1, wherein the step of removing the sacrificial structures comprises either solvent dissolution or vapor-phase etching.

10. The process of claim 1, wherein the step of forming elastomeric probe material into the voids in the sacrificial metal comprises casting a thermosetting silicone elastomer.

11. The process of claim 1, wherein the step of forming elastomeric probe material into the voids in the sacrificial metal comprises casting polydimethylsiloxane (PDMS).

12. The process of claim 1, wherein the probe material is electrically conductive.

13. The process of claim 1, wherein the step of forming elastomeric probe material into the voids in the sacrificial metal further comprises planarizing the elastomeric probe material in the sacrificial metal.

14. The process of claim 1, wherein the step of forming a metal pad upon the second metal layer comprises performing the Guckel process.

15. The process of claim 1, wherein the step of forming a metal contact tip structure upon the metal pad comprises forming the metal contact tip structure out of hard, corrosion-resistant metal.

16. The process of claim 1, wherein the step of forming a metal contact tip structure upon the metal pad comprises forming the metal contact tip structure out of material comprising Rhodium.

17. The process of claim 1, wherein the step of removing at least part of: the second sacrificial metal, the second metal layer, the first sacrificial metal, and the thin electrically conductive metal layer, comprises wet or dry etching.

18. The process of claim 1, further comprising the step of embedding metal in the elastomeric probe material.

19. The process of claim 1, further comprising the step of embedding a wirebond in the elastomeric probe material.

20. The process of claim 1, further comprising the step of at least partially encasing the elastomeric probe material in an outer rigid shell.

21. The process of claim 20, further comprising the step of forming the outer rigid shell from a conductive metal.

22. The process of claim 20, further comprising the step of microfabricating the outer rigid shell directly in place using photolithography or electroforming.

23. A probe array for a microelectronic contactor assembly, the probe array comprising:
a plurality of adjacent probes, each probe comprising:
an electrically conductive reinforcing column adjacent to a compliant and resilient elastomeric column, the electrically conductive reinforcing column having a first top surface and the resilient elastomeric column having a second top surface;
an electrically conductive column cap formed on the first top surface, the electrically conductive column cap electrically connected with an electrically conductive cantilever member that extends away from the first top surface and toward the second top surface where the electrically conductive cantilever member is electrically connected with an electrically conductive contact tip portion that is formed on the second top surface.

24. The probe array of claim 23, wherein the plurality of adjacent probes are separated from each other by air gaps.

25. The probe array of claim 23, wherein the probe array has a pitch equal to or less than 300 µm.

26. The probe array of claim 23, wherein the probe array has a pitch equal to or less than 50 µm.

27. The probe array of claim 23, wherein the electrically conductive column cap, the electrically conductive cantilever member, and the electrically conductive contact tip portion of a probe are all formed from a single piece of metal.

28. The probe array of claim 23, wherein the electrically conductive reinforcing column of a probe comprises a metal post.

* * * * *